(12) United States Patent
Bhat et al.

(10) Patent No.: US 10,056,531 B2
(45) Date of Patent: Aug. 21, 2018

(54) METHOD OF PROCESSING A SEMICONDUCTOR STRUCTURE

(75) Inventors: Jerome Chandra Bhat, Palo Alto, CA (US); Daniel Alexander Steigerwald, Cupertino, CA (US); Michael David Camras, Sunnyvale, CA (US); Han Ho Choi, Sunnyvale, CA (US); Nathan Fredrick Gardner, Sunnyvale, CA (US); Oleg Borisovich Shchekin, San Francisco, CA (US)

(73) Assignee: Lumileds LLC, San Jose, CA (US)

( * ) Notice: Subject to any disclaimer, the term of this patent is extended or adjusted under 35 U.S.C. 154(b) by 547 days.

(21) Appl. No.: 14/238,477

(22) PCT Filed: Aug. 21, 2012

(86) PCT No.: PCT/IB2012/054225
§ 371 (c)(1),
(2), (4) Date: Feb. 12, 2014

(87) PCT Pub. No.: WO2013/030718
PCT Pub. Date: Mar. 7, 2013

(65) Prior Publication Data
US 2014/0179029 A1    Jun. 26, 2014

Related U.S. Application Data

(60) Provisional application No. 61/527,634, filed on Aug. 26, 2011.

(51) Int. Cl.
*H01L 33/50* (2010.01)
*H01L 33/00* (2010.01)
*H01L 21/66* (2006.01)

(52) U.S. Cl.
CPC ............ *H01L 33/507* (2013.01); *H01L 22/24* (2013.01); *H01L 33/0079* (2013.01);
(Continued)

(58) Field of Classification Search
CPC ...................................................... H01L 33/507
See application file for complete search history.

(56) References Cited

U.S. PATENT DOCUMENTS

| 5,403,916 A | 4/1995 | Watanabe et al. |
| 7,521,862 B2 | 4/2009 | Mueller et al. |

(Continued)

FOREIGN PATENT DOCUMENTS

| CN | 101657910 A | 2/2010 |
| DE | 102008039790 A1 | 3/2010 |

(Continued)

OTHER PUBLICATIONS

CN OA, 201280041603.5, dated Feb. 29, 2016, 19 pps.
(Continued)

*Primary Examiner* — Marvin Payen
(74) *Attorney, Agent, or Firm* — Volpe and Koening, P.C.

(57) ABSTRACT

A method according to embodiments of the invention includes providing a wafer including a semiconductor structure grown on a growth substrate, the semiconductor structure comprising a III-nitride light emitting layer sandwiched between an n-type region and a p-type region. The wafer is bonded to a second substrate. The growth substrate is removed. After bonding the wafer to the second substrate, the wafer is processed into multiple light emitting devices.

12 Claims, 7 Drawing Sheets

(52) U.S. Cl.
CPC ........ *H01L 33/0095* (2013.01); *H01L 33/501* (2013.01); *H01L 2933/0041* (2013.01)

(56) References Cited

U.S. PATENT DOCUMENTS

| | | | |
|---|---|---|---|
| 7,553,683 B2 | 6/2009 | Martin et al. |
| 8,236,582 B2 | 8/2012 | Neff et al. |
| 8,581,229 B2 | 11/2013 | Dupont et al. |
| 8,824,319 B2 | 9/2014 | Sawazaki et al. |
| 2002/0171911 A1 | 11/2002 | Maegawa |
| 2005/0104080 A1 | 5/2005 | Ichihara et al. |
| 2006/0006408 A1 | 1/2006 | Suehiro et al. |
| 2006/0237741 A1 | 10/2006 | Takeuchi et al. |
| 2008/0179610 A1 | 7/2008 | Okamoto et al. |
| 2009/0186433 A1 | 7/2009 | Yamaguchi et al. |
| 2010/0019260 A1 | 1/2010 | Epler et al. |

FOREIGN PATENT DOCUMENTS

| | | |
|---|---|---|
| EP | 0611131 A1 | 8/1994 |
| EP | 1744417 A1 | 1/2007 |
| EP | 1798765 A2 | 6/2007 |
| JP | 2002344029 A | 11/2002 |
| JP | 2008159628 | 11/2002 |
| JP | 2005191552 A | 7/2005 |
| JP | 2005259912 A | 9/2005 |
| JP | 2006041479 A | 2/2006 |
| JP | 2006303373 A | 11/2006 |
| JP | 2007-16171 A | 1/2007 |
| JP | 2007016171 A * | 1/2007 |
| JP | 2008135697 A | 6/2008 |
| JP | 2010087292 A | 4/2010 |
| TW | 201044641 A | 12/2010 |
| TW | 201125161 A | 7/2011 |
| WO | 2005/050748 A1 | 6/2005 |
| WO | 2005091390 A1 | 9/2005 |
| WO | WO-2010110204 A1 | 9/2010 |

OTHER PUBLICATIONS

EPO as ISA, PCT/IB2012/054225 filed Aug. 21, 2012, "International Search Report and Written Opinion", dated Dec. 19, 2012, 11 pages.

TW OA3MO, Application 101130877, dated Feb. 18, 2016, 16 pps.

JP Office Action, Application 2014-526585, dated Apr. 26, 2016, 9 pps.

* cited by examiner

METHOD OF PROCESSING A SEMICONDUCTOR STRUCTURE

CROSS-REFERENCE TO PRIOR APPLICATIONS

This application is the U.S. National Phase application under 35 U.S.C. § 371 of International Application No. PCT/IB2012/054225, filed on Aug. 21, 2012, which claims the benefit of U.S. Provisional Patent Application 61/527,634 filed on Aug. 26, 2011. These applications are hereby incorporated by reference herein.

BACKGROUND

Field of Invention

The present invention relates to bonding a wafer including a semiconductor structure to a substrate, then processing the wafer into multiple light emitting devices.

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

With the development of efficient LEDs that emit blue or ultraviolet light, it has become feasible to produce LEDs that generate white light through phosphor conversion of a portion of the primary light emitted by the LED. The phosphor converts a portion of the primary light to secondary light at longer wavelengths. The unconverted primary light may combine with the secondary light to produce white light.

FIG. 13 illustrates a method 100 of forming a phosphor-converted light emitting device, described in more detail in U.S. Pat. No. 7,553,683. First, a sheet of the wavelength converting material is produced (step 102). The sheet of wavelength converting material may be produced using, e.g., a phosphor or other similar luminescent material, that is dispersed in an inorganic material, such as glass. A well homogenized mixture of phosphor and powdered glass is heated in a crucible. After the glass mixture melts, the melt is homogenized in the furnace, then poured onto a plate and permitted to harden in a flat sheet. Once the sheet of wavelength converting material is hardened, the sheet is separated into a number of individual elements (step 104). The individual wavelength converting elements are sized to be mounted over an LED die. A semiconductor light emitting device die is then provided (step 106). The LED die may be a mounted die, e.g., that is mounted in a reflector cup or a submount. Alternatively, the LED die may be unmounted. A wavelength converting element is then bonded to the LED die (step 108).

SUMMARY

It is an object of the invention to provide a method of processing a semiconductor structure into light emitting devices after bonding the semiconductor structure to a second substrate. Processing after bonding may permit the use of higher temperatures during bonding.

A method according to embodiments of the invention includes providing a wafer including a semiconductor structure grown on a growth substrate, the semiconductor structure comprising a light emitting layer sandwiched between an n-type region and a p-type region. The wafer is bonded to a second substrate. The growth substrate is removed. After bonding the wafer to the second substrate, the wafer is processed into multiple light emitting devices.

Since the wafer is processed into light emitting devices after bonding to the second substrate rather than before, higher bonding temperatures and substrate materials requiring higher processing temperatures may be used, which may improve the performance of the light emitting devices.

DETAILED DESCRIPTION

Figure 13:
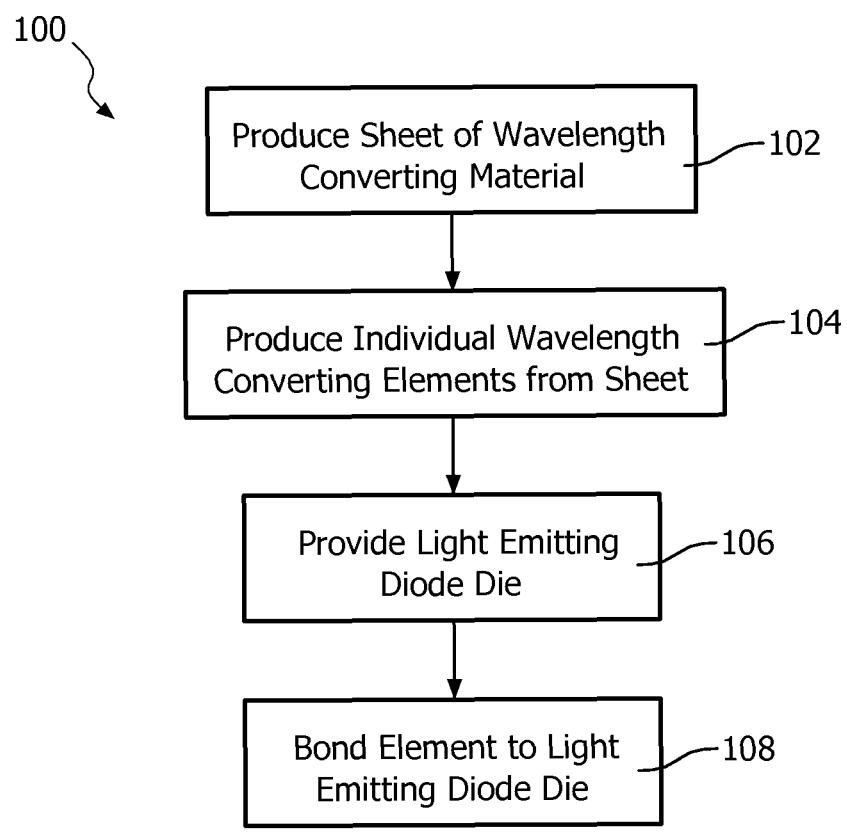
FIG. 13 illustrates a prior art method for forming a phosphor-converted LED.

In the method of FIG. 13, the wavelength-converting glass member is bonded to the LED die after a wafer of semiconductor material is grown, processed into devices, and singulated into individual device chips. After processing and singulation are complete, the LED chips typically can only be processed at temperatures up to ~400° C. Processing LEDs at higher temperatures may result in deterioration of the LED performance characteristics and potential delamination or cracking of the layers deposited during processing. Many suitable glass layers require bonding temperatures greatly in excess of 400° C. As a result, the process temperature constraint of FIG. 13 (~400° C.) limits the choice of materials which can be used. In addition, suitable glasses with lower bonding temperatures tend to be more optically absorbing than suitable glasses having higher bonding temperatures—especially at shorter optical wavelengths. Devices incorporating lower-temperature bonding glasses may thereby incur a performance penalty.

In embodiments of the invention, a semiconductor structure including a light emitting region disposed between an n-type region and a p-type region is bonded to a high index substrate in a wafer scale process, after growth of the semiconductor structure and before the semiconductor structure is further processed, for example by forming metal contacts. The semiconductor structure is then processed into light emitting devices such as light emitting diodes. As used herein, "wafer" refers to a structure before it is divided into smaller structures, such as a growth substrate on which has been grown semiconductor material for many light emitting devices. Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
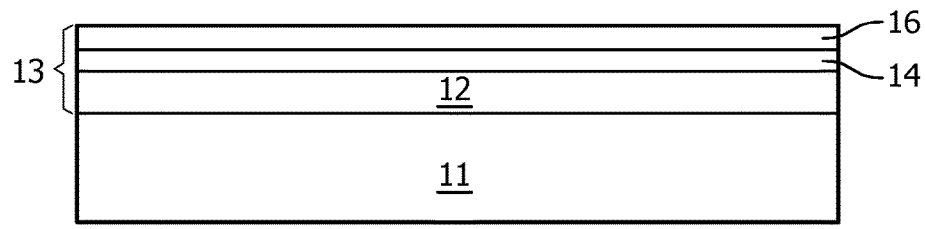
FIG. 1 illustrates a semiconductor structure including an n-type region, a light emitting region, and a p-type region, grown on a growth substrate.

FIG. 1 illustrates a semiconductor structure 13 grown on a growth substrate 11. Substrate 11 may be any suitable substrate such as, for example, sapphire, SiC, Si, GaN, or composite substrates. The semiconductor structure includes a light emitting or active region 14 sandwiched between n- and p-type regions 12 and 16. An n-type region 12 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical or electrical properties desirable for the light emitting region to efficiently emit light. A light emitting or active region 14 is grown over the n-type region 12. Examples of suitable light emitting regions include a single thick or thin light emitting layer, or a multiple quantum well light emitting region including multiple thin or thick light emitting layers separated by barrier layers. A p-type region 16 may then be grown over the light emitting region 14. Like the n-type region 12, the p-type region 16 may include multiple layers of different composition, thickness, and dopant concentration, including layers that are not intentionally doped, or n-type layers. The total thickness of all the semiconductor material in the device is less than 10 µm in some embodiments and less than 6 µm in some embodiments. In some embodiments, the semiconductor material may optionally be annealed at between 200° C. and 800° C. after growth.

Figure 2:
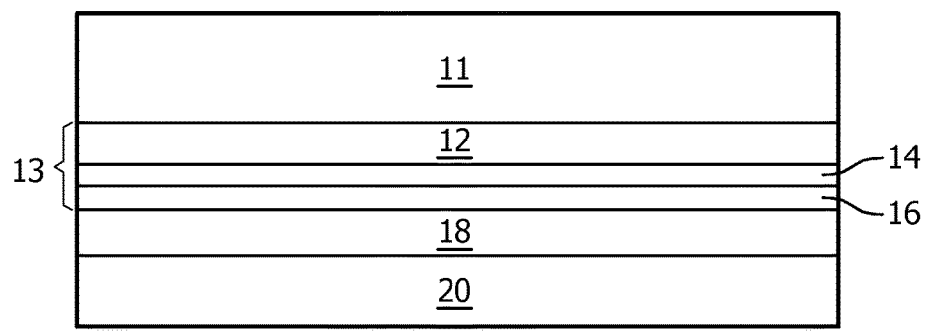
FIG. 2 illustrates the structure of FIG. 1 bonded to a handle.

In some embodiments, the structure grown in FIG. 1 is attached to a handle 20 as illustrated in FIG. 2. Handle 20 mechanically supports semiconductor structure 13 during removal of growth substrate 11. Handle 20 may be, for example, sapphire, silicon, or any other suitable material. In some embodiments, handle 20 is directly bonded to semiconductor structure 13, for example by pressing handle 20 and semiconductor structure 13 together under heat and pressure or by anodic bonding, where handle 20 and semiconductor structure 13 are pressed together under heat and an electrostatic field. In some embodiments, handle 20 is bonded to semiconductor structure 13 by one or more bonding layers 18. A bonding layer may be formed on handle 20 only, on semiconductor structure 13 only, or on both handle 20 and semiconductor structure 13. The bonding layers may be any suitable material, such as, for example, one or more oxides of silicon. After forming the bonding layers, handle 20 and semiconductor structure 13 are pressed together under heat and pressure, or under heat and an electrostatic field. After attaching handle 20, the growth substrate 11 is removed by any technique suitable to the growth substrate material including, for example, laser lift off, etching, or mechanical techniques.

Figure 3:
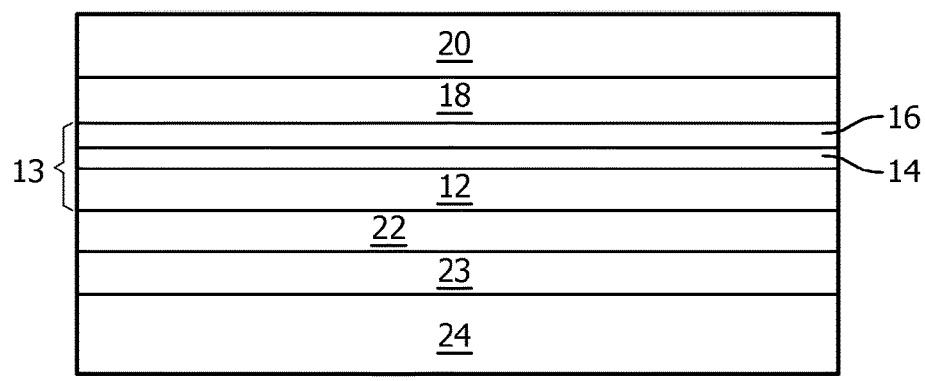
FIG. 3 illustrates the structure of FIG. 2 after removing the growth substrate and bonding to a second substrate.

In the structure illustrated in FIG. 3, the growth substrate has been removed from the structure of FIG. 2, exposing the first-grown layers, n-type region 12 in this example. An optional optical impedance matching layer 22 may be formed on n-type region 12. Optical impedance matching layer 22 enhances extraction from the semiconductor structure without requiring roughening of the surface of the semiconductor structure. Optical impedance matching layer 22 may be, for example, an anti-reflective stack formed by any suitable technique including evaporation and sputtering. In some embodiments, n-type region 12 is roughened. In embodiments where n-type region 12 is roughened, a compliant bonding layer 23 is used which flows to fill the gaps in the roughened surface such that a bond sufficiently free of voids can be formed.

One or more bonding layers 23 are formed on optional optical impedance matching layer 22 if present or on n-type region 12. Bonding layers 23 are often high refractive index (for example, at least 1.5 in some embodiments), low optical absorption layers. Bonding layers 23 may be formed on the optical impedance matching layer 22 (or semiconductor structure 13 if layer 22 is not present), on substrate 24, or on both. Examples of suitable materials for bonding layers 23 include III-V semiconductors including but not limited to gallium arsenide, gallium nitride, gallium phosphide, and indium gallium phosphide; II-VI semiconductors including but not limited to cadmium selenide, cadmium sulfide, cadmium telluride, zinc sulfide, zinc selenide, and zinc telluride; group IV semiconductors and compounds including but not limited to germanium, silicon, and silicon carbide; organic semiconductors, oxides, metal oxides, and rare earth oxides including but not limited to an oxide or nitride of aluminum, antimony, arsenic, bismuth, boron, cadmium, cerium, chromium, cobalt, copper, gallium, germanium, indium, indium tin, lead, lithium, molybdenum, neodymium, nickel, niobium, phosphorous, potassium, silicon, sodium, tellurium, thallium, titanium, tungsten, zinc, or zirconium; oxyhalides such as bismuth oxychloride; fluorides, chlorides, and bromides, including but not limited to fluorides, chlorides, and bromides of calcium, lead, magnesium, potassium, sodium, and zinc; metals including but not limited to indium, magnesium, tin, and zinc; yttrium aluminum garnet (YAG), phosphide compounds, arsenide compounds, antimonide compounds, nitride compounds, high index organic compounds; and mixtures or alloys thereof. Bonding layer or layers 23 may be applied by any suitable method, including evaporating, sputtering, chemical vapor deposition, dispensing, printing, spray coating, spin coating, or blade coating. A high index bond material may be deposited in fluid form, and may remain fluid up to the moment of connection, or may be partially solidified or gelled at the moment of connection, or may be a solid that tackifies upon heating to enable easy connection. The high index bond material may react to form a solidified bond that may range from a gelled state to a hard resin.

The semiconductor structure is bonded to a substrate 24 via bonding layers 23. Substrate 24 may be a transparent, high refractive index material such as glass pre-formed into a substrate wafer then bonded to semiconductor structure 13. The index of refraction of the glasses above may be in the range of 1.5 to 2.2 or higher in some embodiments, closely matched to the refractive index of GaN (2.4). Suitable materials for substrate 24 include but are not limited to electrical insulating materials, non-semiconductor materials, frit glass, suitable high refractive-index glasses, such as lead chloride, lead bromide, potassium fluoride, zinc fluoride, an oxide of aluminum, antimony, bismuth, boron, lead, lithium, phosphorus, potassium, silicon, sodium, tellurium, thallium, tungsten, or zinc, or any mixtures thereof. High refractive-index glasses also include materials such as Schott glass LaSFN35, LaF10, NZK7, NLAF21, LaSFN18, SF59, or LaSF3, or Ohara glass SLAH51 or SLAM60, or mixtures thereof, glasses such as (Ge, As, Sb, Ga)(S, Se, Te, F, Cl, I, Br) chalcogenide and chalcogen-halogenide glasses, for example. In some embodiments, substrate 24 may include or be formed from lower index materials, such as glass, magnesium fluoride and polymers. Both high and low index resins, such as silicone or siloxane, are available from manufacturers such as Shin-Etsu Chemical Co., Ltd., Tokyo, Japan. The side chains of the siloxane backbone may be modified to change the refractive index of the silicone.

Glasses which are substantially free of traditional organic-based adhesives such as epoxies tend to have higher refractive induces since the organic adhesives tend to have low indices of refraction. These organic-based adhesives also tend to degrade under a combination of short-wavelength light and elevated temperature, limiting the max operating temperature of the LED to ~150° C. Therefore, in some embodiments, substrate 24 is an organic-free material, which may allow for more efficient operation of the LED, and/or operation at higher temperatures.

In some embodiments, substrate 24 is a matrix of any of the above materials, into which is incorporated one or more luminescent materials that convert light of wavelengths emitted by the light emitting region to other wavelengths. All or only a portion of the light emitted by the light emitting region and incident on the wavelength converting material may be converted by the wavelength converting material. Unconverted light emitted by the light emitting region may be part of the final spectrum of light, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device. The wavelength converting material may be conventional phosphor particles, organic semiconductors, II-VI or III-V semiconductors, II-VI or III-V semiconductor quantum dots or nanocrystals, dyes, polymers, or materials such as GaN that luminesce. If substrate 24 includes conventional phosphor particles, in some embodiments substrate 24 is thick enough to accommodate particles typically having a size of about 5 microns to about 50 microns. Any suitable phosphor may be used, including garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAl-GaG), $(Ba_{1-x}Sr_x)SiO_3$:Eu (BOSE), and nitride-based phosphors such as $(Ca,Sr)AlSiN_3$:Eu and $(Ca,Sr,Ba)_2Si_5N_8$:Eu.

In some embodiments, substrate 24 is a ceramic, which may be wavelength converting. A ceramic substrate 24 may be formed by, for example, sintering phosphor particles such as any of the phosphors listed above, or sintering other materials such as $Al_2O_3$, $ZrO_2$, SiC, AlON, SiON, AlSiON, titanates such as barium titanate, calcium titanate, strontium titanate, lead zirconate titanate, or unactivated YAG. A ceramic substrate 24 may be transparent, translucent, or scattering.

In some embodiments, semiconductor structure 13 is bonded to substrate 24 by pressing the two structures together at elevated temperature. For example, the bonding temperature may be up to 800° C. in some embodiments, greater than 400° C. in some embodiments, greater than 500° C. in some embodiments, and between 500 and 800° C. in some embodiments. In some embodiments, pressures less than 90 kN may also be applied at the time of bonding. In some embodiments, an electrical potential difference may also be applied between the semiconductor structure 13 and substrate 24.

Figure 4:
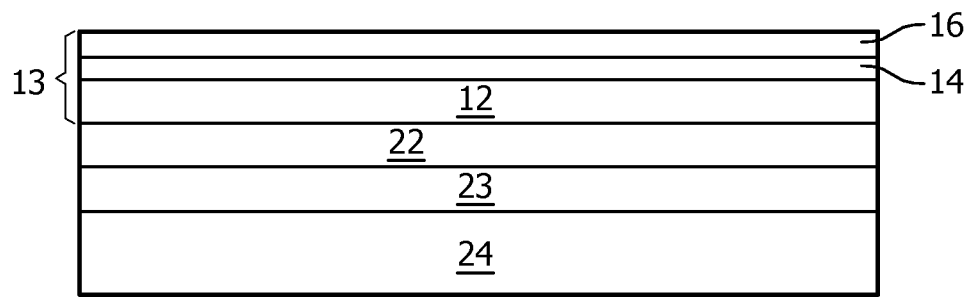
FIG. 4 illustrates the structure of FIG. 3 after removing the handle.

As illustrated in FIG. 4, after bonding to substrate 24, handle 20 is removed, for example by etching, mechanical separation, laser lift off, or any other suitable technique. Any bonding material 18 remaining after removing handle 20 is removed, for example by etching. In the structure illustrated in FIG. 4, the semiconductor structure is bonded to substrate 24 through the surface of n-type region 12. The top surface of p-type region 16 is exposed.

Figure 5:
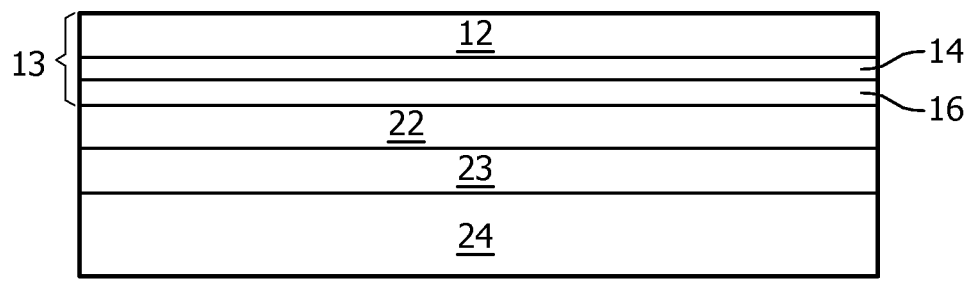
FIG. 5 illustrates the structure of FIG. 1 after bonding to a second substrate and removing the growth substrate.

As an alternative to the process illustrated in FIGS. 2, 3, and 4, the structure of FIG. 1 may be processed into the structure illustrated in FIG. 5. In the structure illustrated in FIG. 5, an optional optical impedance matching layer 22 is formed on the top surface of the p-type region 16 of the semiconductor structure illustrated in FIG. 1. One or more bonding layers 23 are formed, then the semiconductor structure is bonded to substrate 24, as described above in reference to FIG. 3. The growth substrate 11 is then removed, as described above. In the structure illustrated in FIG. 5, semiconductor structure 13 is bonded to substrate 24 via p-type region 16. The top surface of n-type region 12 is exposed.

Figure 6:
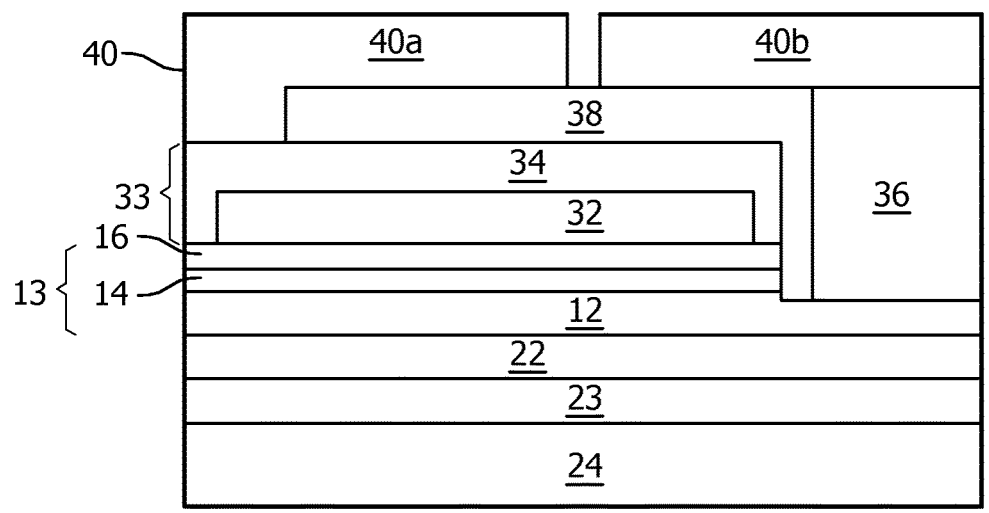
FIG. 6 illustrates a portion of the structure illustrated in FIG. 4 after forming a metal p-contact, etching a mesa, and forming a metal n-contact.

FIG. 6 illustrates the structures of FIG. 4 after forming metal contacts electrically connected to the n- and p-type regions. P-contact 33 is formed first. The p-contact 33 illustrated includes two metal layers 32 and 34. Metal 32 may be deposited by, for example, evaporation or sputtering, then patterned by standard photolithographic operations including, for example, etching or lift-off. Metal 32 may be a reflective metal that makes an ohmic contact with p-type III-nitride material such as, for example, silver. Metal 32 may also be a multi-layer stack of a transition metal and silver. The transition metal may be, for example, nickel. Metal 32 is between 100 Å and 2000 Å thick in some embodiments, between 500 Å and 1700 Å thick in some embodiments, and between 1000 Å and 1600 Å in some embodiments. The structure may optionally be annealed after deposition of metal 32.

An optional second p-contact metal 34 may be deposited over p-contact metal 32 by, for example, evaporation or sputtering, then patterned by standard photolithographic operations such as, for example, etching or lift-off. Metal 34 may be any electrically-conductive material which reacts minimally with silver, such as, for example, an alloy of titanium and tungsten. This alloy may be nitrided either partially, wholly, or not at all. Metal 34 may alternatively be chromium, platinum or silicon, or may be a multi-layer stack of any of the above materials optimized for adhesion to surrounding layers and for blocking diffusion of metal 32. Metal 34 may be between 1000 Å and 10000 Å thick in some embodiments, between 2000 Å and 8000 Å in some embodiments, and between 2000 Å and 7000 Å thick in some embodiments.

The structure is then patterned by standard photolithographic operations and etched by, for example, reactive ion etching (RIE), where chemically reactive plasma is used to remove the semiconductor material, or inductively coupled plasma (ICP) etching, an RIE process where the plasma is generated by an RF-powered magnetic field. In some embodiments, the pattern is determined by the photolithographic mask used to pattern p-contact metal 34. In these embodiments, etching may be performed subsequent to etching of p-contact metal 34 in a single operation. In some regions, the entire thickness of p-type region 16 and the entire thickness of light emitting region 14 are removed, revealing a surface of n-type region 12.

A metal n-contact 36 is formed on the portion of n-type region 12 exposed by etching away the p-type region and the light emitting region. N-contact 36 may be any suitable metal including aluminum or a multi-layer stack of metals including aluminum, titanium-tungsten alloy, copper and gold. In embodiments where n-contact 36 is a multi-layer stack, the first metal (i.e. the metal adjacent to n-type region 12) may be selected to form an ohmic contact to GaN and to be reflective of blue and white light. Such a first layer may be, for example, aluminum. N-contact 36 may be deposited by any suitable process including, for example, sputtering, evaporation, plating, or a combination of these processes.

A dielectric 38 may be deposited over the structure, for example by plasma-enhanced chemical vapor deposition (PECVD), chemical vapor deposition (CVD), or evaporation. Dielectric 38 electrical isolates n-contact 36 and p-contact 33. Dielectric 38 is patterned by standard photolithographic operations and etched by ICP etching or RIE to expose n-contact 36 and p-contact 33. Dielectric 38 may be any suitable dielectric including silicon nitride, silicon oxide and silicon oxy-nitride. In some embodiments, dielectric 38 is a reflective stack. Dielectric 38 may be formed before or after the formation of n-contact 36.

Bonding pads 40a and 40b may be formed over the n- and p-contacts and dielectric 38, to redistribute the n- and p-contacts into large conductive pads suitable for bonding to another structure such as, for example, a PC board. Bonding pads are typically metal but may be any suitable conductive material. Bonding pad 40a is electrically connected to p-type region 16 through p-contact 33. Bonding pad 40b is electrically connected to n-type region 12 through re-contact 36. Bonding pads 40 may be, for example, Cu, or multi-layer metal stack comprising, for example Ti, TiW, Cu, Ni, and Au, deposited by sputtering, or by a combination of sputtering and plating. Bonding pads 40a and 40b may be electrically isolated by a gap, as illustrated in FIGS. 6 and 7, or by a solid dielectric such as the materials described above in reference to dielectric 38.

Figure 7:
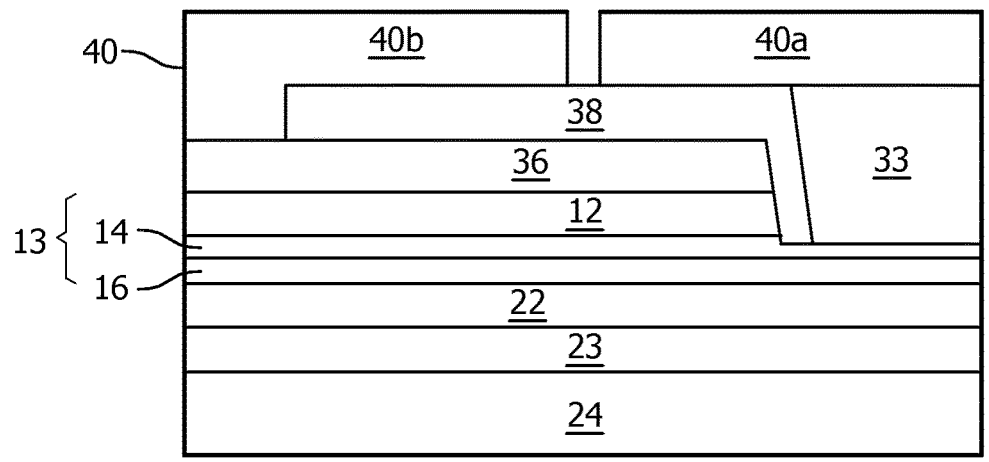
FIG. 7 illustrates a portion of the structure illustrated in FIG. 5 after forming a metal re-contact, etching a mesa, and forming a metal p-contact.
Figure 8:
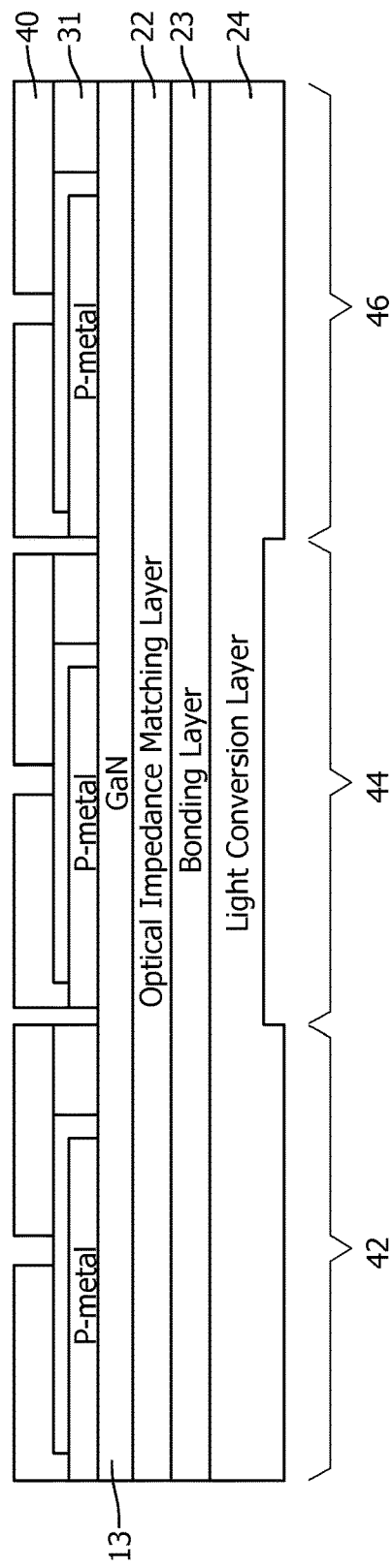
FIG. 8 illustrates a portion of a wafer of devices after adjusting the amount of wavelength converting material in the substrate.

FIG. 7 illustrates the structure of FIG. 5 after forming metal contacts electrically connected to the n- and p-type regions. FIG. 7 is the reverse of FIG. 6—an n-contact 36 may be formed first, then a portion of n-type region 12 and light emitting region 14 are etched away to reveal p-type region 16, then a p-contact 33 is formed on the exposed portion of p-type region 16. N- and p-contacts 36 and 33 are electrically isolated by dielectric layer 38. Bonding pads 40a and 40b are electrically connected to p- and n-contacts 33 and 36, respectively. The n- and p-contact metals 36 and 33, dielectric 38, and bonding pads 40 may be the same materials formed in the same manner as described above in reference to FIG. 6.

Though only one device is illustrated in each of FIGS. 6 and 7, it is to be understood that the processing steps illustrated and described above typically occur on a wafer including multiple devices. In some embodiments, the n-contact and/or p-contact may be distributed, such that multiple n-contact openings in FIG. 6 and multiple p-contact openings in FIG. 7 are etched. In FIGS. 8, 9, 10, 11, and 12, multiple devices are illustrated which may be either the device illustrated in FIG. 6 or the device illustrated in FIG. 7. In FIGS. 8, 9, 10, 11, and 12, the semiconductor structure 13 may have either the p-type region 16 on top as illustrated in FIG. 6 or the n-type region 12 on top as illustrated in FIG. 7. Similarly, the metal contacts 33 and 36 and dielectric 38 shown as structure 31 in FIGS. 8, 9, 10, 11, and 12 may be formed in the configuration illustrated in FIG. 6 or the configuration illustrated in FIG. 7.

After the individual devices on the wafer are completed, the full wafer may be tested. In embodiments where substrate 24 is wavelength converting, the color of each LED may be tuned in the optional step illustrated in FIG. 8. The structure of FIG. 8 includes a portion of a wafer including semiconductor structure 13. Three devices, 42, 44, and 46 are illustrated. Based on the test results, the color of each individual LED die on the wafer may be further tuned by modifying the amount of wavelength converting material present—per device—based on the test results. If the device does not produce the desired wavelength spectrum at full wafer test, the thickness of the wavelength converting substrate 24 is altered, e.g., by depositing additional wavelength converting material locally (devices 42 and 46) or by removing some of the wavelength converting material locally (device 44) by ablation, etching or dissolution. If required, it is possible to test and re-adjust the wavelength converting material thickness several times until the desired wavelength spectrum of light is produced. The thickness of the light conversion layer is controlled in response to the light produced by the LEDs resulting in a highly reproducible color. Moreover, because the thickness of the light conversion layer altered in response to the specific wavelengths produced by the LEDs, a variation in the wavelengths of light produced by LEDs across the wafer can be accommodated. Accordingly, fewer LEDs may be rejected for producing light with an undesirable wavelength spectrum.

Figure 9:
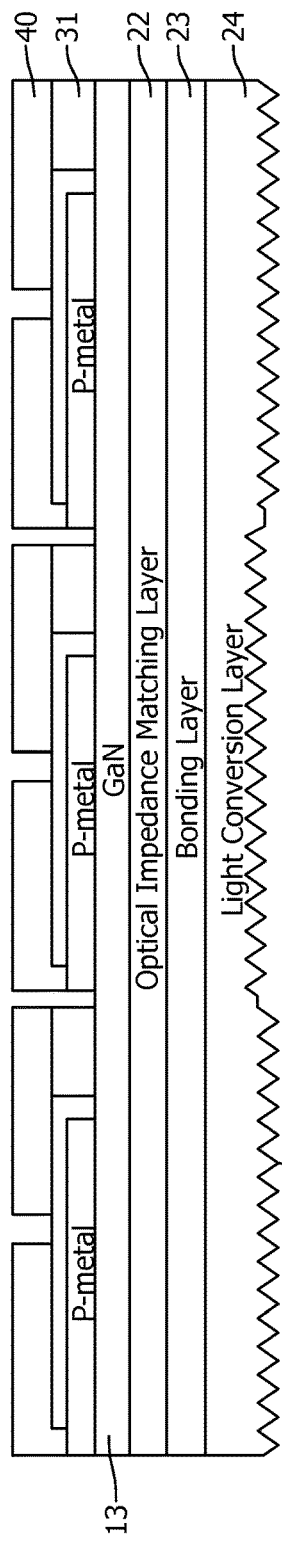
FIG. 9 illustrates a portion of a wafer of devices after texturing the substrate.

In FIG. 9, the surface 48 of substrate 24 opposite the surface in contact with bonding layer or layers 23 is optionally textured, by roughening or patterning, which may improve light extraction. Texturing may be performed by any suitable technique including, for example, etching, laser ablation, or by laminating another structure on to the substrate 24, such as a grating or a lens such as a Fresnel lens.

Figure 10:
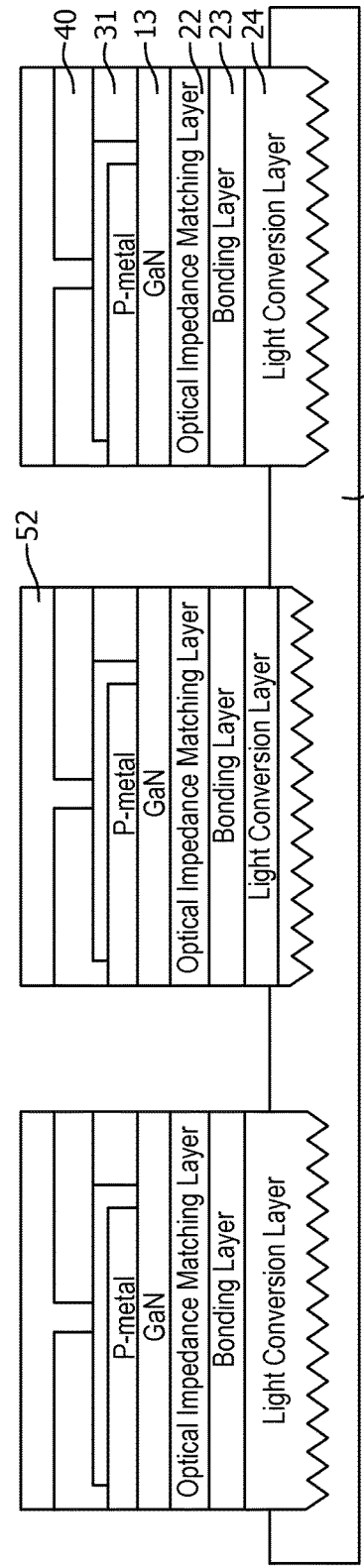
FIG. 10 illustrates three devices after singulating a wafer of devices.
Figure 11:
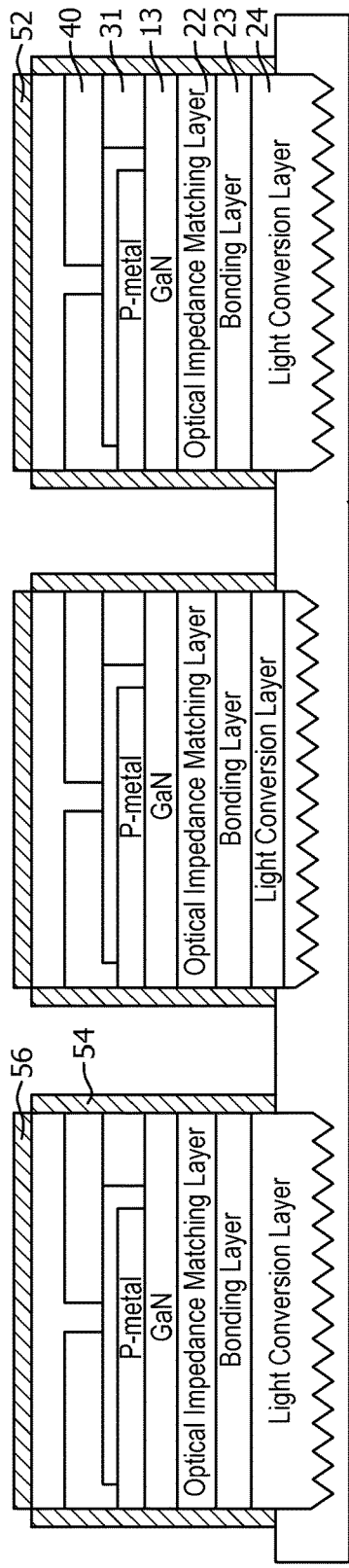
FIG. 11 illustrates three devices after forming a dielectric coating.
Figure 12:
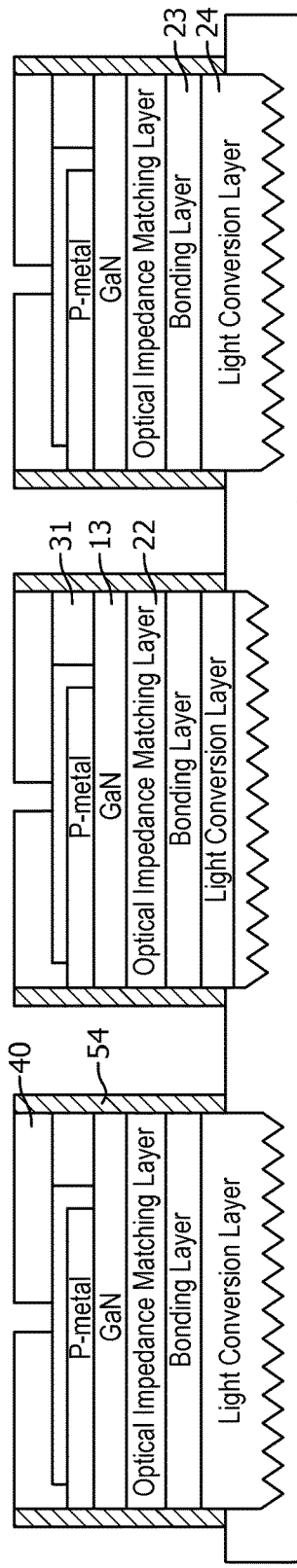
FIG. 12 illustrates three devices after removing excess dielectric coating.

In FIG. 10, a protective lift-off polymer layer 52 is deposited on the top of the wafer, then the wafer of devices is singulated into device chips. Each device chip may include a single light emitting diode or a group of light emitting diodes. Since the semiconductor structure 13 and substrate 24 are diced together, the substrate is no wider than the device, as illustrated in FIGS. 10, 11, and 12. Singulation may be performed, for example, by conventionally sawing, by laser ablation using 193 nm, 248 nm, or 355 nm light, or by water jet cutting. Singulation may also be performed via a combination of scribing and mechanical breaking, scribing being performed, for example, by conventionally sawing, by laser ablation using 193 nm, 248 nm, or 355 nm light, or by water jet cutting.

In FIG. 11, an optional reflective coating is formed over the top 56 and sides 54 of the devices. For example, the reflective coating is formed over protective lift-off polymer layer 52, and on the sides of polymer layer 52, bonding pads 40a and 40b, structure 31, semiconductor structure 13, bonding layer 23, and substrate 24. The coating may be, for example, a highly reflective dielectric stack formed by any suitable technique including evaporation. The side coating 54 reduces or eliminates leakage of light from the sides of each device. The coating on the tops 56 of the devices is removed in FIG. 12 when the protective lift-off polymer layer 52 is removed to expose bonding pads 40. The device can now be attached to any suitable structure, for example to a PC board by soldering.

Though the examples above illustrate flip chip devices, it is possible to use other device geometries, including devices with transparent contacts where light is extracted from the device through the contacts and vertical devices with top and bottom contacts. In a vertical device, a portion of substrate 24 may be removed or not formed to accommodate a contact, for example with a metal-filled via. Alternatively, a contact in a vertical device may be formed on an electrically conducting substrate 24. In the examples illustrated above, a majority of light is directed out of the semiconductor structure toward substrate 24. In some embodiments, such as a device with transparent contacts or a vertical device, a majority of light may be directed out of the semiconductor structure toward a surface of the semiconductor structure opposite substrate 24. In such embodiments, a reflective bonding layer may be used such as a reflective metal, and substrate 24 may be transparent or opaque. A metal bonding layer may also be used as a contact.

Embodiments of the invention may offer advantages over conventional processing. Prior to the processing illustrated in FIGS. 6 and 7 (i.e. the formation of metal contacts and dielectric layers), the semiconductor structure 13 can be processed at temperatures up to ~800° C. Since the semiconductor structure 13 is bonded to substrate 24 before the processing illustrated in FIGS. 6 and 7, substrate 24 can be made from a high melting point, high refractive index material. High melting point, high refractive index glasses often have lower optical absorption than lower meting point high refractive index glasses. The use of a substrate 24 with lower optical absorption may improve the performance of the device. In addition, high temperature softening point glasses generally have lower coefficients of thermal expansion (CTEs) which are better matched to the CTE of a III-nitride semiconductor structure 13 than the CTEs of lower melting point glasses. The resulting structures may therefore have reduced built-in stresses, which may reduce the tendency of the structure to crack or delaminate due to stress build-up during temp cycling, despite the high temperature at which semiconductor structure 13 is bonded to substrate 24.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
providing a wafer comprising a semiconductor structure grown on a growth substrate, the semiconductor structure comprising a III-nitride light emitting layer sandwiched between an n-type region and a p-type region;
bonding the wafer to a transparent substrate that comprises a wavelength converting material disposed in glass;
removing the growth substrate;
after bonding the wafer to the transparent substrate, processing the wafer into multiple light emitting devices;
testing the wafer after processing the wafer into multiple light emitting devices and before dicing the wafer; and
adjusting an amount of wavelength converting material corresponding to each light emitting device according to the results of the testing.

2. The method of claim 1 wherein adjusting comprises removing wavelength converting material by laser ablation.

3. The method of claim 1 wherein adjusting comprises adding wavelength converting material.

4. The method of claim 1 wherein bonding the wafer to a second substrate comprises pressing the wafer and the second substrate together at a temperature greater than 500° C.

5. The method of claim 1 wherein processing the wafer into multiple light emitting devices comprises:
forming a metal contact on the p-type region;
removing a portion of the light emitting layer and the p-type region to reveal a portion of the n-type region; and
forming a metal contact on the n-type region exposed by removing a portion of the light emitting layer and the p-type region.

6. The method of claim 1 wherein processing the wafer into multiple light emitting devices comprises dicing the wafer into single light emitting diodes or groups of light emitting diodes.

7. A method comprising:
providing a wafer comprising a semiconductor structure grown on a growth substrate, the semiconductor structure comprising a III-nitride light emitting layer sandwiched between an n-type region and a p-type region;
bonding, using a bonding material, the wafer to a transparent substrate that comprises a wavelength converting material disposed in glass;
removing the growth substrate; and
after bonding the wafer to the second substrate, processing the wafer into multiple light emitting devices.

8. The method of claim 1 further comprising forming an optical impedance matching layer on the semiconductor structure prior to bonding.

9. The method of claim 1 further comprising texturing a surface of the second substrate opposite a surface bonded to the semiconductor structure.

10. The method of claim 1 wherein processing the wafer into multiple light emitting devices occurs after removing the growth substrate.

11. The method of claim 1 further comprising bonding the wafer to a handle before removing the growth substrate, wherein bonding the wafer to a second substrate occurs after removing the growth substrate while the semiconductor structure is bonded to the handle.

12. The method of claim 1 further comprising forming a reflective contact on a surface of the semiconductor structure opposite a surface bonded to the second substrate.

* * * * *